United States Patent
Azuma et al.

(10) Patent No.: US 6,169,325 B1
(45) Date of Patent: Jan. 2, 2001

(54) SEMICONDUCTOR DEVICE

(75) Inventors: Shuichiro Azuma, Fuchu; Takayuki Okinaga, Hanno; Takashi Emata, Akiruno; Tomoaki Kudaishi, Kodaira; Tamaki Wada, Higashimurayama; Kunihiko Nishi, Kokubunji; Masachika Masuda, Tokorozawa; Toshio Sugano, Kodaira, all of (JP)

(73) Assignees: Hitachi, Ltd.; Hitachi ULSI Systems Co., Ltd., both of Tokyo (JP)

( * ) Notice: Under 35 U.S.C. 154(b), the term of this patent shall be extended for 0 days.

(21) Appl. No.: 09/210,883

(22) Filed: Dec. 15, 1998

(30) Foreign Application Priority Data

Dec. 17, 1997 (JP) .................................................. 9-347871

(51) Int. Cl.[7] .................................................. H01L 23/02
(52) U.S. Cl. ..................... 257/685; 257/685; 257/686; 257/723; 257/724; 257/778
(58) Field of Search .................... 257/685, 686, 257/723, 724, 778; 439/68; 361/767, 768, 803, 760, 783, 736, 737

(56) References Cited

U.S. PATENT DOCUMENTS

| Re. 36,325 | * | 10/1999 | Corbett et al. | 257/685 |
|---|---|---|---|---|
| 4,984,064 | * | 1/1991 | Toshio | 357/80 |
| 5,057,907 | | 10/1991 | Ooi et la. . | |
| 5,103,247 | * | 4/1992 | Sugano et al. | 361/400 |
| 5,227,664 | * | 7/1993 | Toshio et al. | 257/723 |
| 5,239,447 | * | 8/1993 | Cotues et al. | 361/744 |
| 5,396,102 | * | 3/1995 | Toshio et al. | 257/723 |
| 5,661,339 | * | 8/1997 | Clayton | 257/678 |
| 5,731,633 | * | 3/1998 | Clayton | 257/723 |
| 5,973,404 | * | 10/1999 | Akram et al. | 257/778 |
| 6,049,975 | * | 4/2000 | Clayton | 257/668 |

FOREIGN PATENT DOCUMENTS

| 531 724 | 3/1993 | (EP) . |
|---|---|---|
| 575 806 | 12/1993 | (EP) . |
| 4-65135 | 3/1992 | (JP) . |
| 7-321441 | 12/1995 | (JP) . |
| 8-191127 | 7/1996 | (JP) . |

* cited by examiner

*Primary Examiner*—David Hardy
*Assistant Examiner*—Lourdes Cruz
(74) *Attorney, Agent, or Firm*—Mattingly, Stanger & Malur, P.C.

(57) ABSTRACT

To realize low-profile electronic apparatus (a memory module and a memory card) of a large storage size by mounting tape carrier packages (TCPs) with a memory chip encapsulated onto a wiring board in high density. To be more specific, a TCP is composed of an insulating tape, leads formed on one side thereof, a potting resin with a semiconductor chip encapsulated, and a pair of support leads arranged on two opposite short sides. The pair of support leads function to hold the TCP at a constant tilt angle relative to the mounting surface of the wiring board. By varying the length vertical to the mounting surface, the TCP can be mounted to a desired tilt angle.

12 Claims, 22 Drawing Sheets

SEMICONDUCTOR DEVICE

BACKGROUND OF THE INVENTION

The present invention relates to a semiconductor device and an electronic apparatus and, more particularly, to a low-profile mass-storage electronic apparatus in which tape carrier packages (TCPs) with a memory chip encapsulated are mounted on a wiring board in high density.

For high-density mounting of semiconductor-chip-encapsulated packages on a wiring board, a method has been proposed in which these packages are arranged in a tilted relation to the mounting surface of the wiring board.

For example, Japanese Published Unexamined Patent Application Nos. Hei 7(1995)-321441 and Hei 8(1996)-191127 disclose mounting structures in which the lead extended from one side of a resin-encapsulated package is bent in a slanting direction to mount the package on the wiring board in a tilted relation to the mounting surface thereof and the package is supported by a supporting member extended from another side of the package to prevent-the same from falling down.

Further, Japanese Published Unexamined Patent Application No. Hei 4(1992)-65135 discloses a mounting structure in which a lead extended from one end of a tape carrier package is bent to a given angle to mount the tape carrier package in a vertical or tilted relation to the mounting surface of the wiring board.

SUMMARY OF THE INVENTION

However, in many of the conventional tilt-mount structures, each package is tilted at an angle of 45 degrees or more relative to the mounting surface of the wiring board, so that, when packages are mounted on both sides of the mounting board, the thickness thereof increases, making it difficult to be applied to a low-profile electronic apparatus strictly restricted in height dimensions such as a memory module and a memory card.

It is therefore an object of the present invention to provide a low-profile electronic apparatus in which chip packages are mounted on both sides of a wiring board with high density and the thickness (or height) of the wiring board is held small.

The foregoing and other objects and novel features of the invention will be apparent from the description herein and attached drawing.

The following briefly describes representative ones of the inventions to be disclosed by the present application.

(1) In a semiconductor device of this invention, a plurality of tape carrier packages are mounted on at least one surface of a wiring board, each of the plurality of tape carrier packages is mounted on the wiring board with a tilt through a support lead for regulating an angle of the tilt relative to a mounting surface of the wiring board.

(2) In the semiconductor device of (1), the plurality of tape carrier packages mounted along a direction in which a plurality of leads extended from each of the plurality of tape carrier packages are mounted so that the plurality of tape carrier packages alternate inside the mounting surface of the wiring board.

(3) In the semiconductor device of (1), the plurality of tape carrier packages mounted on the front surface of the wiring board and the plurality of tape carrier packages mounted on the rear side of the wiring board at positions opposite to those of the plurality of tape carrier packages mounted on the front surface are mounted such that a plurality of leads extended from the tape carrier packages mounted on the front side are opposite to those of the plurality of tape carrier packages mounted on the rear side.

(4) In the semiconductor device of (1), a portion of each of the plurality of tape carrier packages gets under the adjacent tape carrier package.

(5) In the semiconductor device of (1), each of the plurality of tape carrier packages is pivotally mounted at a joint between the wiring board and the plurality of leads.

(6) In the semiconductor device of (1), each of the plurality of leads extended from each of the plurality of tape carrier packages is formed halfway with a bent.

(7) In the semiconductor device of (1), each of the plurality of tape carrier packages is mounted such that the tilt angle is not more than 45 degrees relative to the mounting surface of the wiring board.

(8) In the semiconductor device of (1), the rear surface of a semiconductor chip encapsulated in each of the plurality of tape carrier packages is exposed.

(9) In the semiconductor device of (1), an empty area of the wiring board is mounted with en electronic part other than the plurality of tape carrier packages.

(10) In an electronic apparatus of this invention, the wiring board and the plurality of tape carrier packages of (1) mounted on at least one surface of the wiring board are accommodated in a case.

(11) In the electronic apparatus of (10) the case is formed at a portion thereof with an opening for heat dissipation.

(12) In the electronic apparatus of (10), a spacer about as high as the mounting height of the plurality of tape carrier packages is inserted in a gap between the plurality of tape carrier packages mounted on the wiring board.

(13) The electronic apparatus according to the invention is a memory module.

(14) The electronic apparatus according to the invention is a memory card.

BRIEF DESCRIPTION OF THE DRAWINGS

These and other objects of the invention will be seen by reference to the description, taken in connection with the accompanying drawing, in which.

DETAILED DESCRIPTION OF THE PREFERRED EMBODIMENTS

This invention will be described in further detail by way of example with reference to the accompanying drawings.

Preferred Embodiment 1

Figure 1:
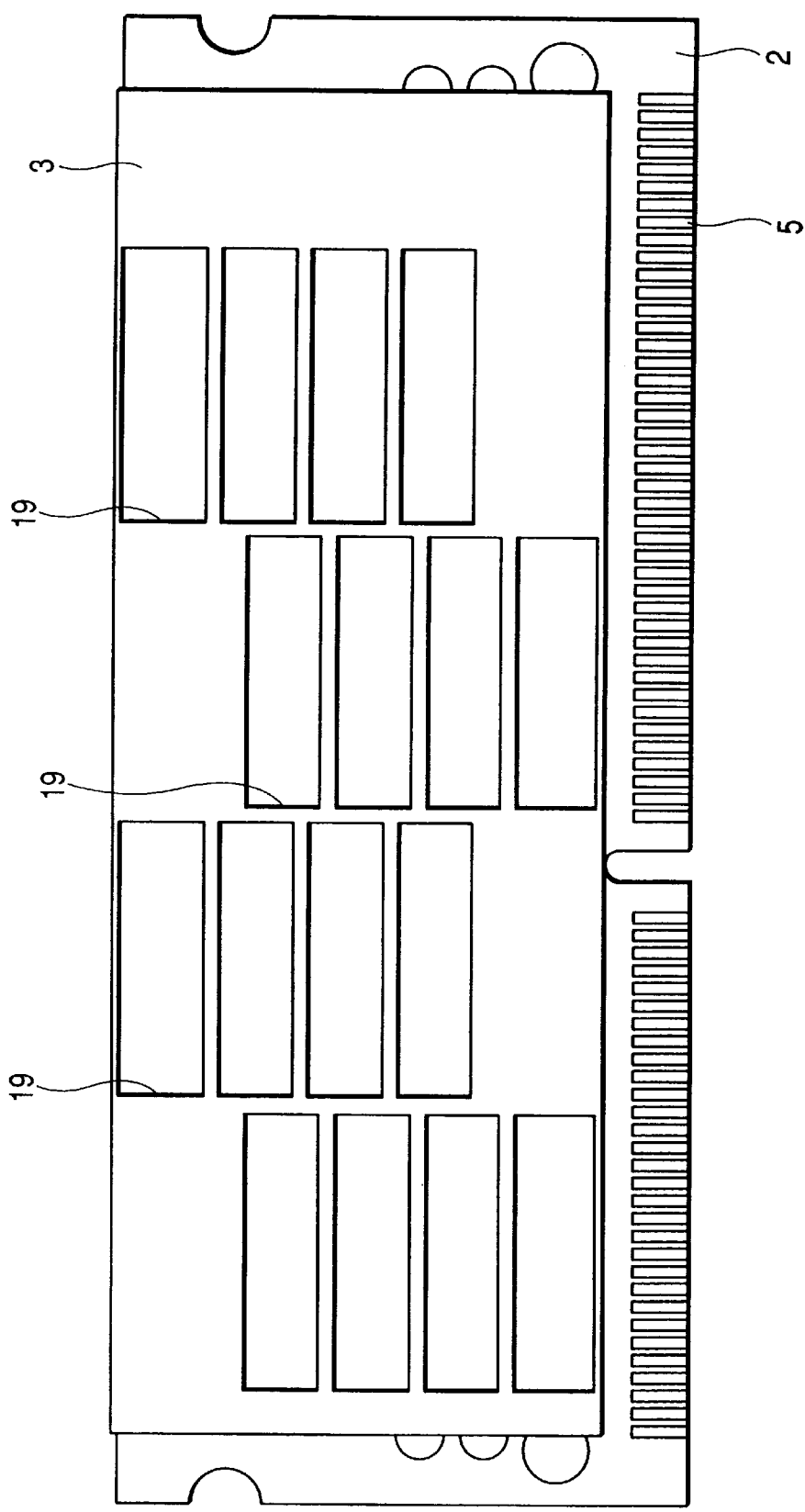
FIG. 1 is a top view illustrating a memory module practiced as one preferred embodiment of the invention.
Figure 2:
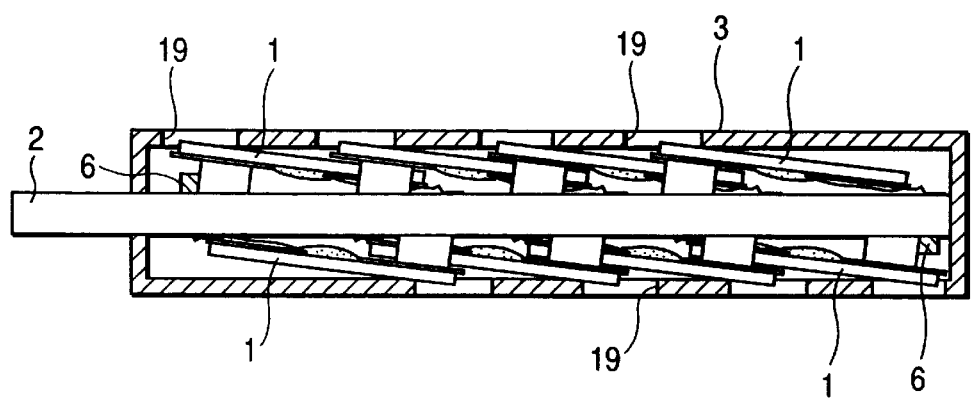
FIG. 2 is a side view illustrating the above-mentioned preferred embodiment.

FIG. 1 is a top view illustrating an electronic apparatus practiced as one preferred embodiment of the present invention. FIG. 2 is a side view illustrating the electronic apparatus shown in FIG. 1.

The above-mentioned electronic apparatus is a dual in-line memory module (DIMM) for use as a main memory of a note-size personal computer for example. As shown, this memory module comprises a wiring board 2 mounted on both sides thereof with a plurality of tape carrier packages (TCPs) 1 and a case 3 for accommodating the wiring board 2. The case 3 is provided at one part thereof with a slit 19 for letting the heat generated in the TCP 1 escape outside.

Figure 3:
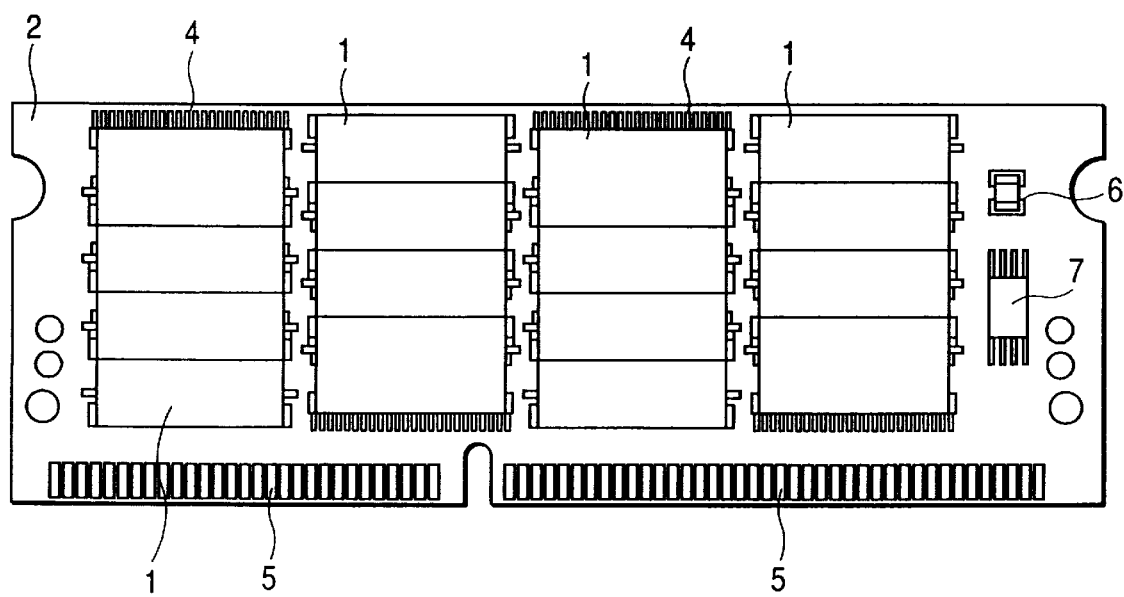
FIG. 3 is a top view illustrating the front surface of a wiring board with tape carrier packages mounted.
Figure 4:
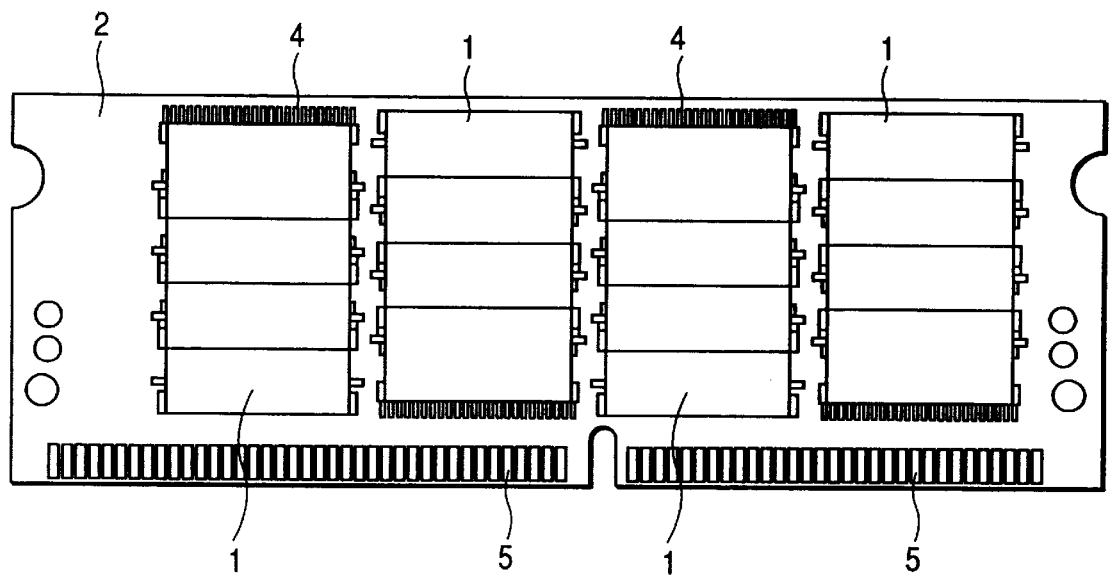
FIG. 4 is a top view illustrating the rear surface of the wiring board with tape carrier packages mounted.
Figure 5:
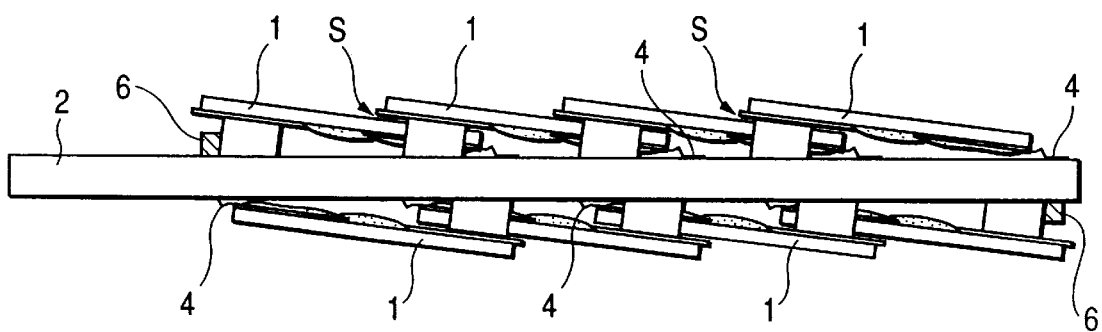
FIG. 5 is a side view illustrating the wiring board in the short direction thereof with tape carrier package mounted.

FIG. 3 is a top view illustrating the top surface of the wiring board 2 with the TCP 1 mounted. FIG. 4 is a top view illustrating the rear surface of the wiring board 2 with the TCP 1 mounted. FIG. 5 is a side view illustrating a short side of the wiring board 2 with the TCP 1 mounted.

The wiring board 2 made of a rectangular glass epoxy resin sheet having a thickness of about 0.4 mm, a height (short side) of about 25.4 mm, and a width (long side) of about 67.6 mm is mounted on each of the top and rear surfaces thereof with four rows of the TCPs 1 along the short and long sides of the wiring board 2, amount to a total of 4×4=16 (32 on both surfaces). Each of these TCPs 1 encapsulates a semiconductor chip (not shown) formed with a 16-megabit (Mbit) DRAM (Dynamic Random Access Memory) for example. Each TCP 1 is electrically connected to the wiring board 2 through a plurality of leads 4 arranged in a row along one side of the TCP 1.

One of the long sides of the wiring board 2 provides a connector. The connector is arranged on the top and rear sides thereof with a plurality of terminals (connector pins) 5 in a row for inserting this memory module into a socket of the mother board. Also, the wiring board 2 is mounted in an excess area thereof with small electronic parts 6 and 7 such as a chip capacitor and a clock generator as required.

The 32 TCPs 1 mounted on the wiring board 2 are all of the same dimensions. These TCPs I are all mounted at a small tilt angle of about 8 degrees relative to the mounting surface. In this mounting structure, the total thickness of the wiring board 2 including the TCPs 1 on both the sides is extremely small, complying with the strict memory module specifications in height (a maximum total height of 3.8 mm).

As shown in FIG. 5, of the four TCPs 1 arranged in a row along the short side of the wiring board 2, the three TCPs 1 except the TCP 1 at one end of the wiring board are mounted such that each gets at one part thereof under the adjacent TCP 1. This mounting structure allows the mounting of higher density than that the all four TCPs 1 are mounted flat to the mounting surface. As described above, each TCP 1 is mounted at a small tilt angle not more than 45 degrees, so that the surface area of each of these three TCPs 1 not covered by the adjacent TCP 1 increases, thereby enhancing heat dissipation of the densely mounted TCPs 1.

As shown in FIG. 5, a slight gap S is provided in the overlapped portion between adjacent TCPs 1 along the short direction of the wiring board 2. That is, these TCPs 1 are mounted such that each does not come in contact with the other. This mounting structure facilitates the air convection in the gap between the adjacent TCPs 1 mounted in a tilted relation to the mounting surface of the wiring board 2, further enhancing heat dissipation of the densely mounted TCPs 1.

Referring to FIGS. 3 and 4, of the 16 TCPs 1 mounted on each side of the wiring board 2, the TCPs 1 in the left-most row and the third row from the left end of the wiring board are arranged such that their leads 4 come to the top of the wiring board. On the other hand, the TCPs 1 in the second and fourth rows from the left end of the wiring board are arranged such that their leads 4 come to the bottom (the connector side) of the wiring board. In other words, the four rows of TCPs 1 arranged along the long side of the wiring board 2 are mounted such that each row alternates 180 degrees to the other in the mounting surface.

The above-mentioned mounting structure allows the wiring of groups of wires for interconnecting the same pins of the two adjacent rows of TCPs 1 along the long side of the wiring board 2 without intersecting the wiring groups within the same mounting surface. Consequently, the number of wires to be laid from one side of the wiring board 2 to the other by way of through-holes is reduced as compared with the mounting in which the 16 TCPs 1 are arranged in the same direction. This arrangement in turn reduces the number of through-holes and the length of wiring, thereby realizing the high-density mounting of many TCPs 1 on the wiring board 2 limited in mounting area.

As shown in FIG. 5, the TCP 1 mounted on one side of the wiring board 2 and the TCP 1 mounted on the other side in an opposite manner are arranged such that the leads 4 of these TCPs 1 are directed in the opposite directions (to the left side and the right side in the figure). In this mounting structure, the pins of the TCPs 1 which are opposed to each other with the wiring board 2 sandwiched in are directed in the same direction. Consequently, the number of wires to be laid from one side of the wiring board 2 to the other by way of through-holes is reduced as compared with the mounting structure in which the TCPs 1 mounted on both sides of the wiring board 2 are directed in the same direction. This in turn reduces the number of through-holes and the length of wiring, thereby realizing the high-density mounting of many TCPs 1 on the wiring board 2 limited in mounting area.

Figure 6A:
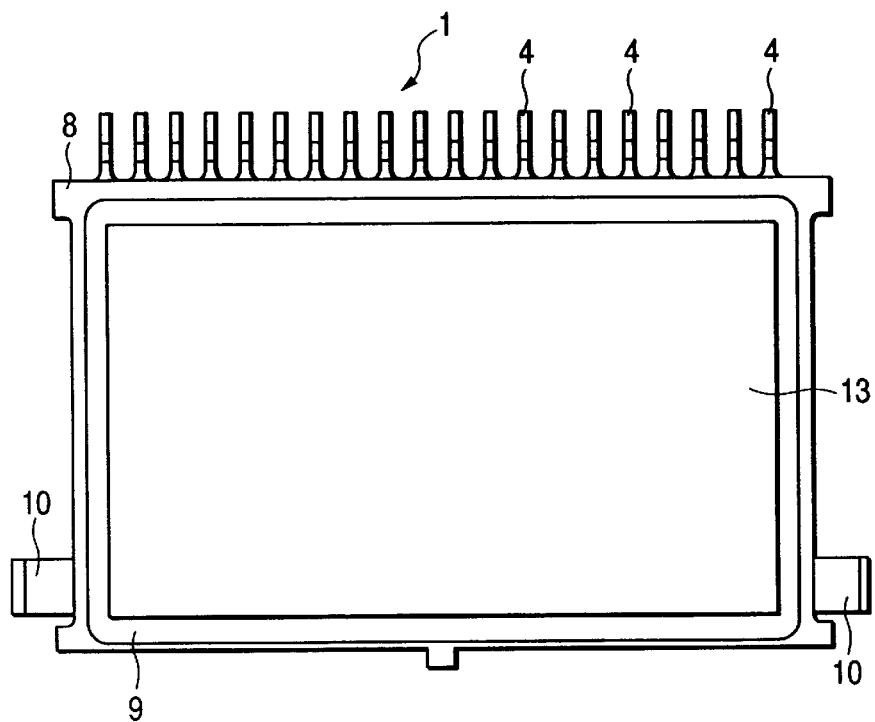
FIG. 6A is a top view illustrating a tape carrier package.
Figure 6B:
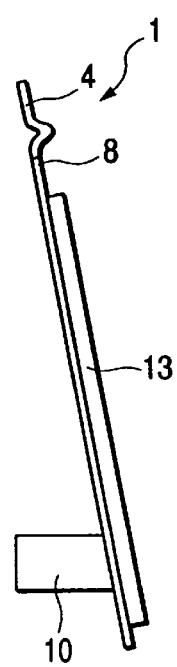
FIG. 6B is a side view illustrating the tape carrier package.
Figure 7:
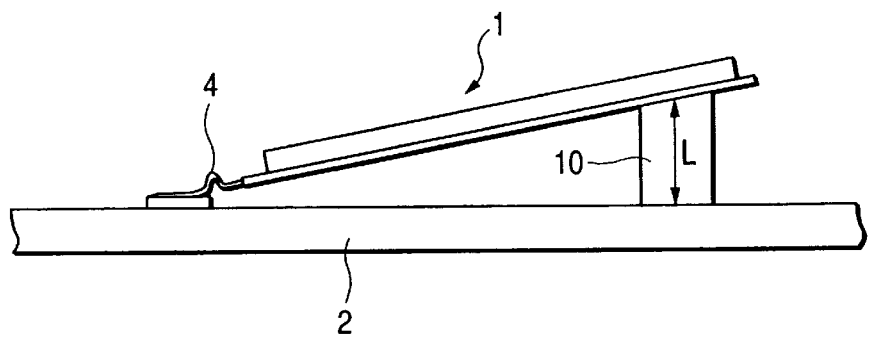
FIG. 7 is a side view illustrating a state in which the tape carrier package is mounted in a tilted manner by use of a support lead.

Referring to FIG. 6A (the top view of the TCP 1) and FIG. 6B (the side view of the TCP 1), the TCP 1 has an insulating tape 8, the plurality of leads 4 arranged on one side of the tape, a potting resin 9 for encapsulating a semiconductor chip 13, and a pair of support leads 10 arranged at two opposite short sides. As shown in FIG. 7, support leads 10 function to hold the TCP 1 to a constant tilt angle relative to the mounting surface of the wiring board 2. Varying distance (L) vertical to the mounting surface allows the TCP 1 to be mounted at a desired tilt angle.

To fabricate the above-mentioned TCP 1, the insulating tape 8 formed with the leads 4 and the pair of support leads 10 on one side is prepared at the outset. It should be noted that the insulating tape 8, which is usually long, is shown only in its part (for carrying only a single TCP).

The insulating tape 8 is formed by a polyimide resin for example. The leads 4 and the pair of support leads 10 are formed by etching a metal foil such as a rolled copper foil laminated on one side of the insulating tape 8. One end (the tip of the inner lead portion 4a) of each lead 4 extends into inside a device hole 12 in which the semiconductor chip is arranged. The base end portion 4b of the outer lead portion 4c of each lead 4 is wider than the other portion of the outer lead to prevent the potting resin 9 from trailing (in the direction of the tip of the outer lead 4c), reinforce the leads 4, and prevent the same from being delaminated.

Figure 9:
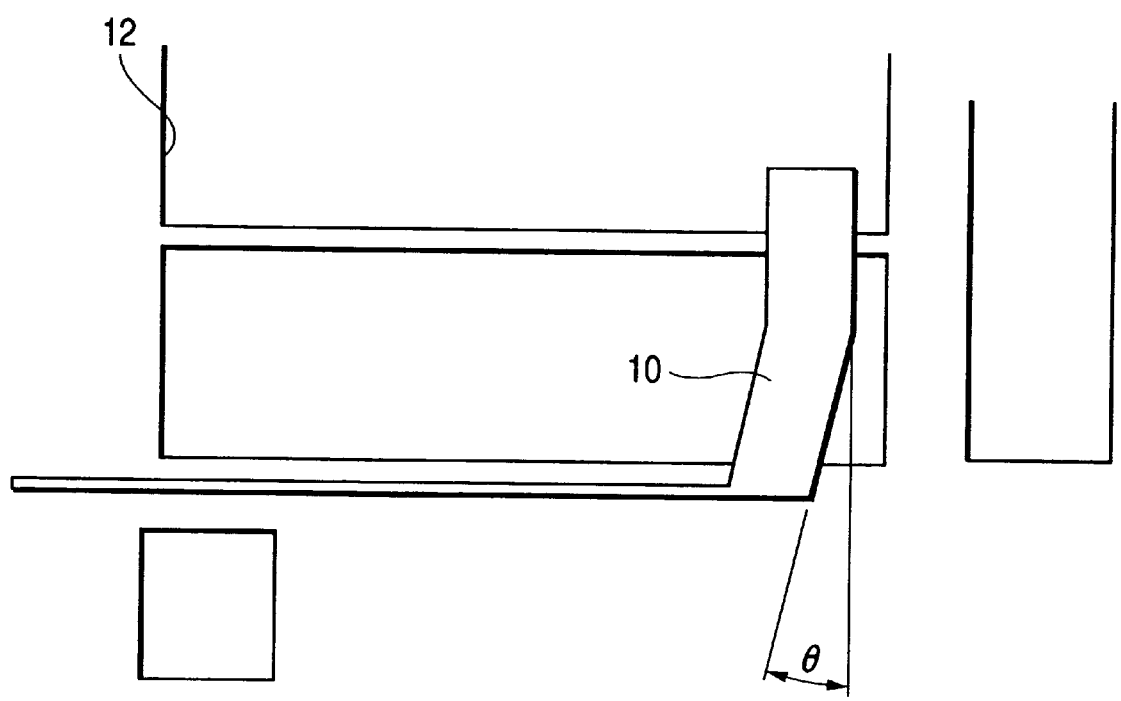
FIG. 9 is a expanded top view illustrating a support lead formed on one surface of an insulating tape.
Figure 10A:
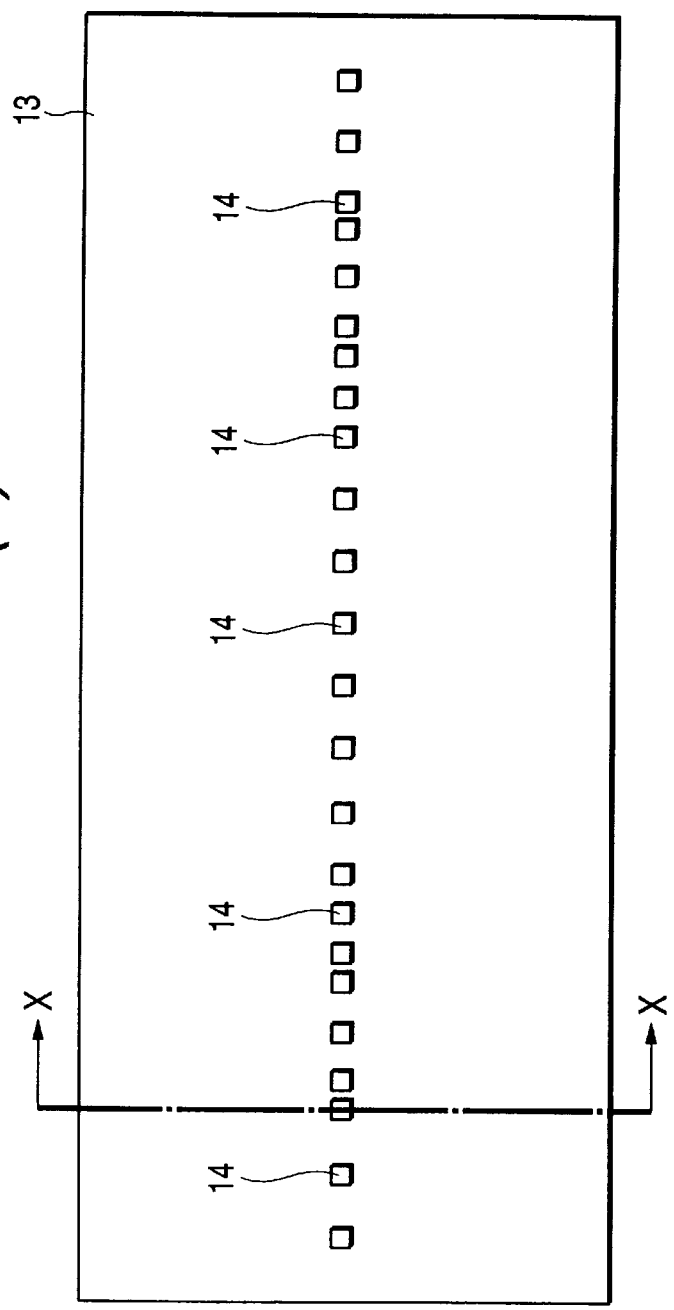
FIG. 10 is a top view illustrating a semiconductor chip to be mounted on the tape carrier package.
Figure 10B:
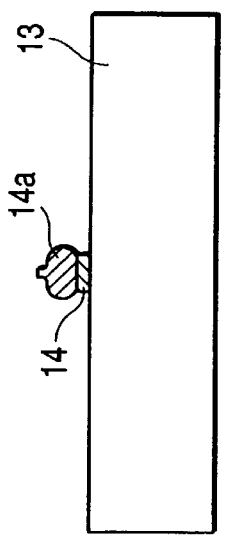

As shown in FIG. 9 in an expanded manner, the support lead 10 is bent halfway toward the short side by an angle (θ) relative to the long side of the TCP 1. Adjusting the bend angle (θ) in this portion determines the tilt angle (θ) at which the TCP 1 is mounted on the wiring board 2. In the present embodiment, this bend angle (θ) is set to about 8 degrees.

Next, a semiconductor chip 13 as shown in FIG. 1A is prepared. The semiconductor chip 1 is formed on the main surface thereof with a 16-megabit DRAM. A plurality of bonding pads 14 are also formed on the main surface of the semiconductor chip 13 in the center area of the chip along its long side. A gold (Au) bump electrode 14a for electrically connecting the tip of the inner lead 4a to the pad 14 is connected to each bonding pad 14 on the surface thereof as shown in FIG. 14B.

Figure 11:
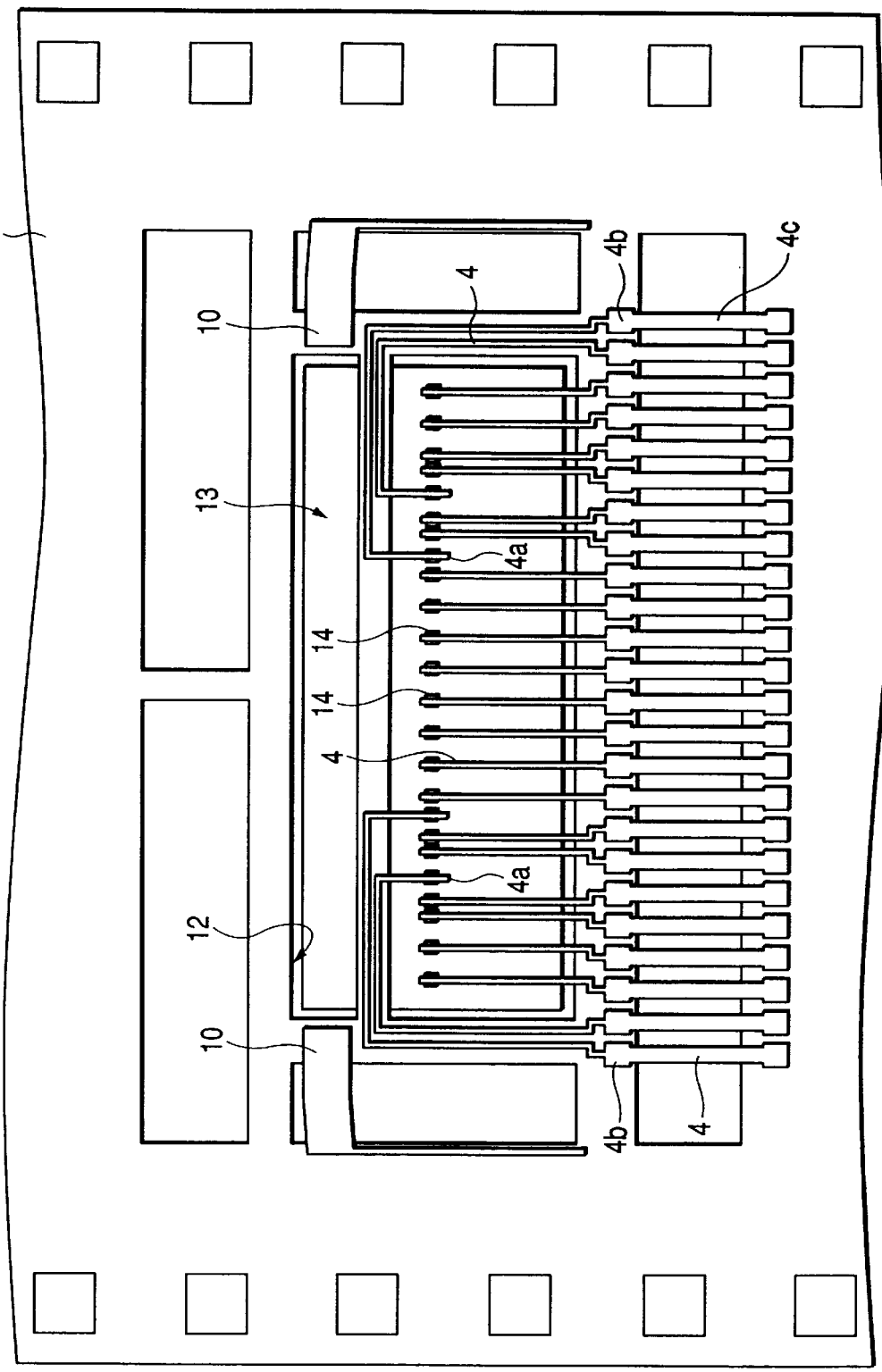
FIG. 11 is a top view illustrating a method of fabricating the tape carrier package.

The semiconductor chip 13 is positioned inside the device hole 12 of the insulating tape 8 as shown in FIG. 11. Then, the bonding pad 14 of the semiconductor chip 13 is electrically connected to the corresponding inner lead portion 4a at one end portion through the Au bump electrode 14a by use of a known inner lead bonder, not shown.

Figure 12:
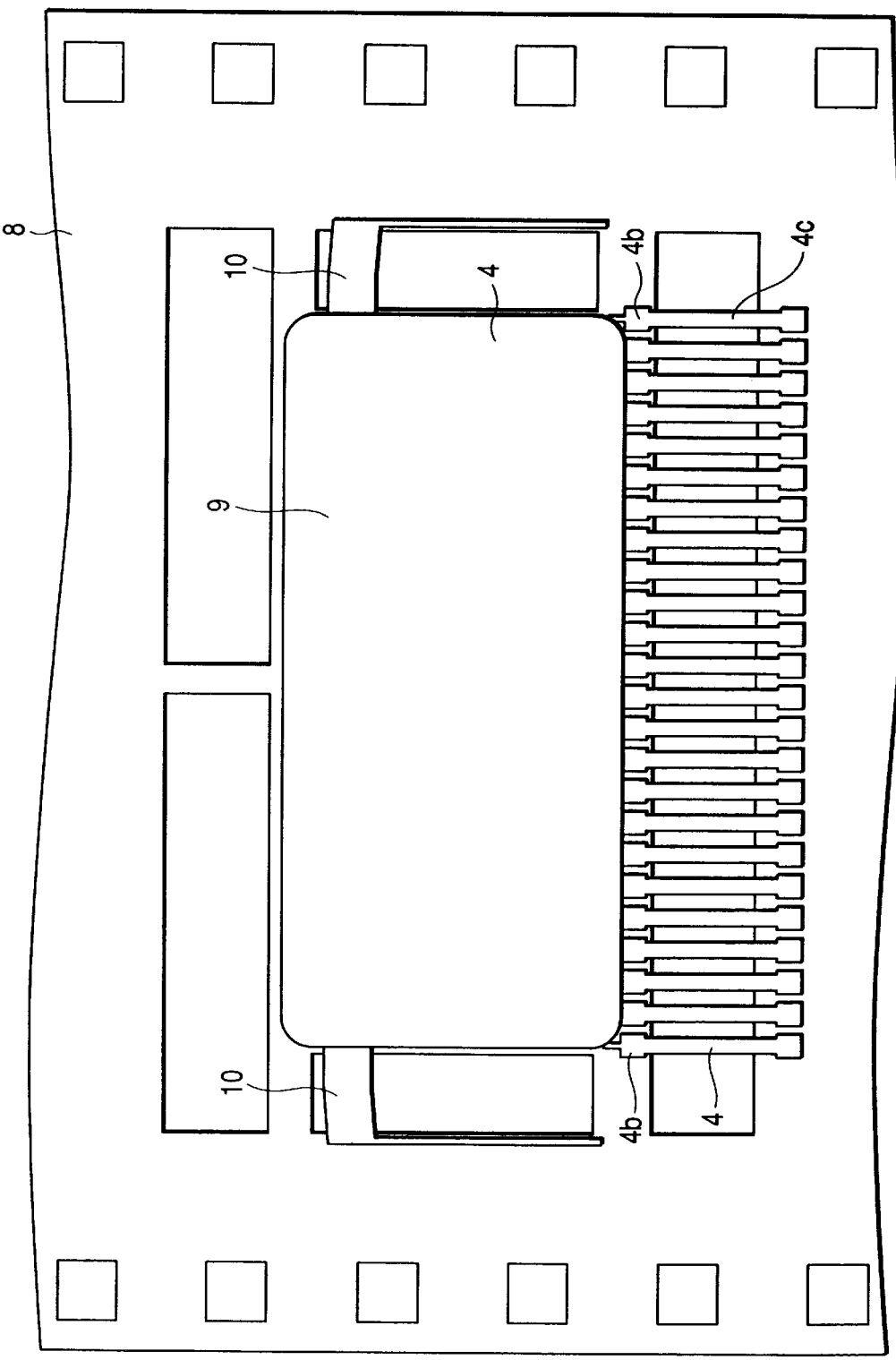
FIG. 12 is a top view illustrating the method of fabricating the tape carrier package.

As shown in FIG. 12, the main surface side of the semiconductor chip including the junction between bonding pad 14 of the semiconductor chip 13 and the lead 4a is encapsulated with the potting resin 9 of epoxy type.

Figure 13:
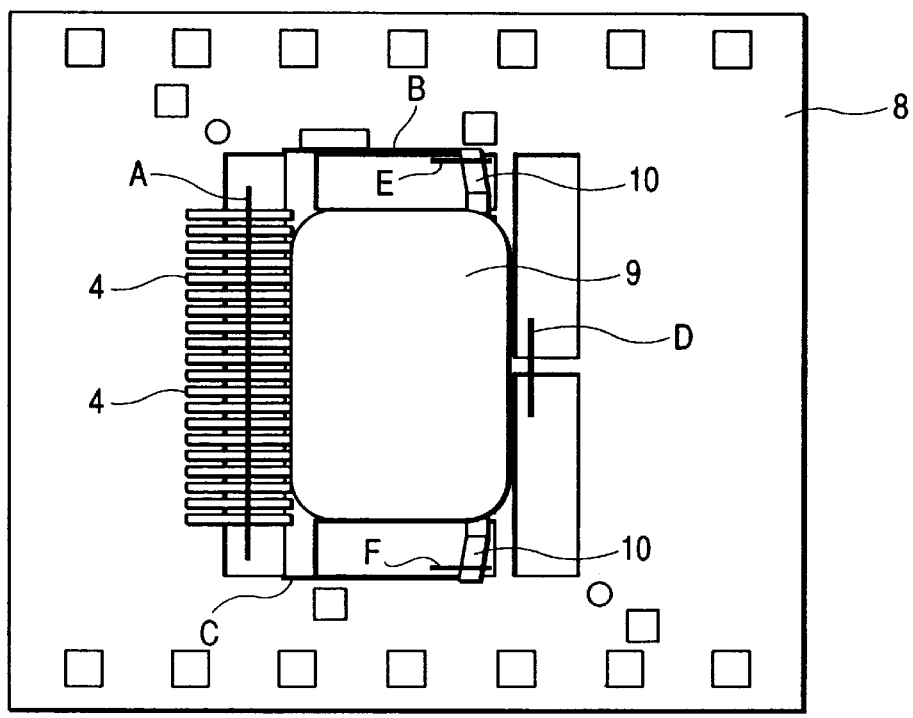
FIG. 13 is a top view illustrating the method of fabricating the tape carrier package.

The outer lead portion 4c of each lead 4, the support lead 10, and a part of the insulating tape 8 are cut at the positions indicated by thick lines (A to F) shown in FIG. 13, the support lead 10 is bent at halfway thereof by 90 degrees, and the outer lead portion 4c of the lead 4 is bent into the shape as shown in FIG. 6B by use of a known cutting and forming die (not shown) Thus, the TCP 1 is completed.

Figure 14A:
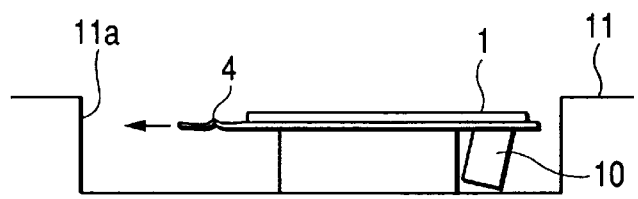
FIG. 14A and FIG. 14B are diagrams illustrating methods of mounting the tape carrier package.
Figure 14B:
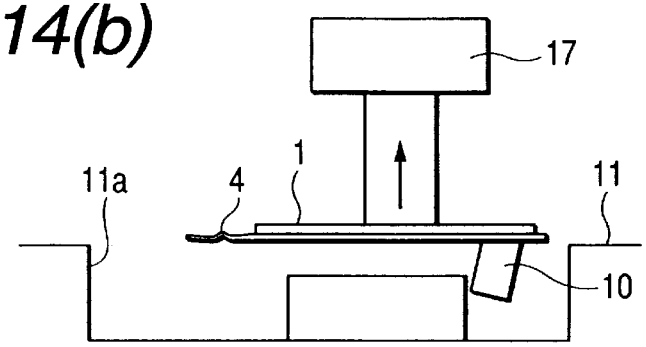
Figure 15:
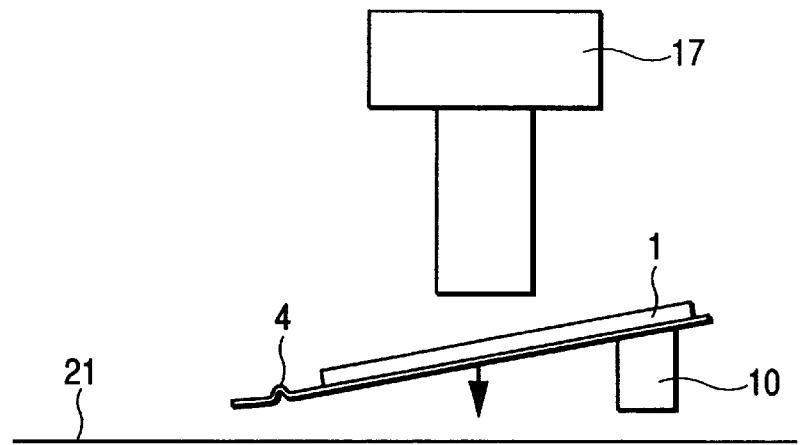
FIG. 15 is a diagram illustrating the method of mounting the tape carrier package.
Figure 16:
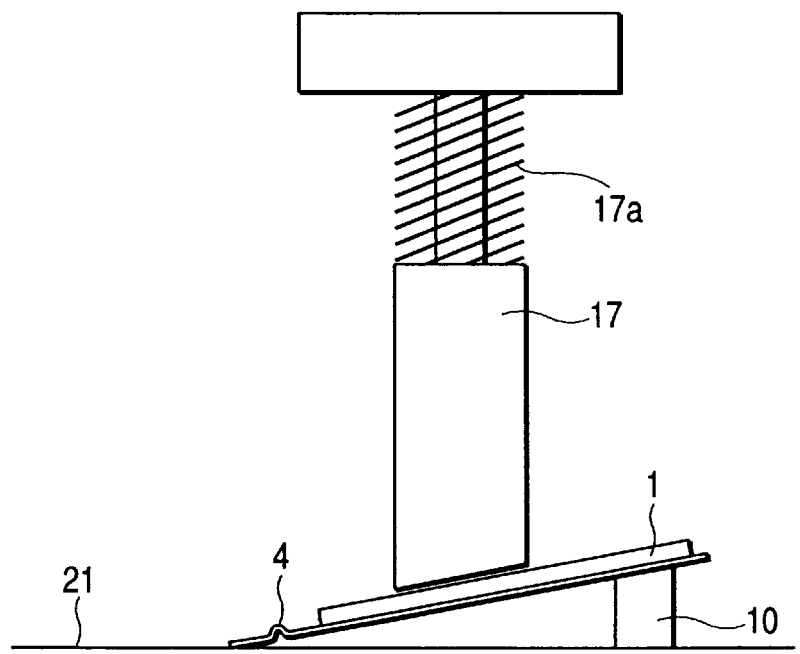
FIG. 16 is a diagram illustrating the method of mounting the tape carrier package.

To mount the TCP 1 thus obtained on the wiring board 2, the TCP 1 horizontally accommodated beforehand in a pocket 11a of a tray 11 as shown in FIG. 14A is held by a vacuum nozzle 17 and placed on a positioning stage 21 shown in FIG. 15. At this moment, the tip of the vacuum nozzle 17 is constituted by a soft member such as a rubber or soft resin for example and a load mitigating mechanism for making this tip portion vertically movable by use of a spring 17a is provided on the vacuum nozzle 17. These provisions prevent the lead 4 and the support lead 10 from being deformed by the weight of the vacuum nozzle 17 when the TCP 1 is brought down into intimate contact with the positioning stage 21 by the vacuum nozzle 17. In addition, the vacuum nozzle 17 is provided at the bottom thereof with a tilt of the same angle (about 8 degrees) as the tilt angle of the TCP 1 as shown, allowing the TCP 1 to be vacuum-held with the tilt angle kept unchanged.

Figure 17A:
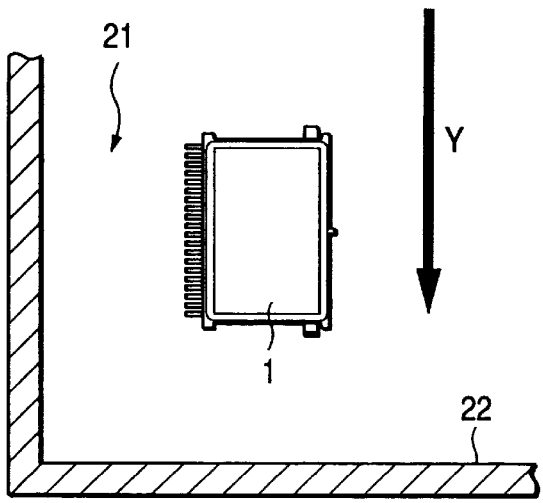
FIG. 17A to FIG. 17C are diagrams illustrating methods of mounting the tape carrier package.
Figure 17B:
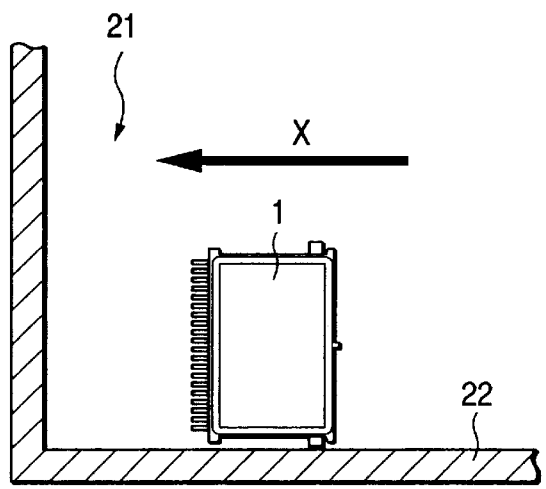
Figure 17C:
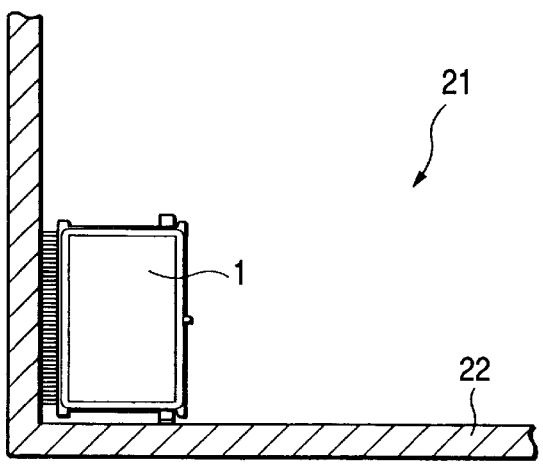
Figure 18:
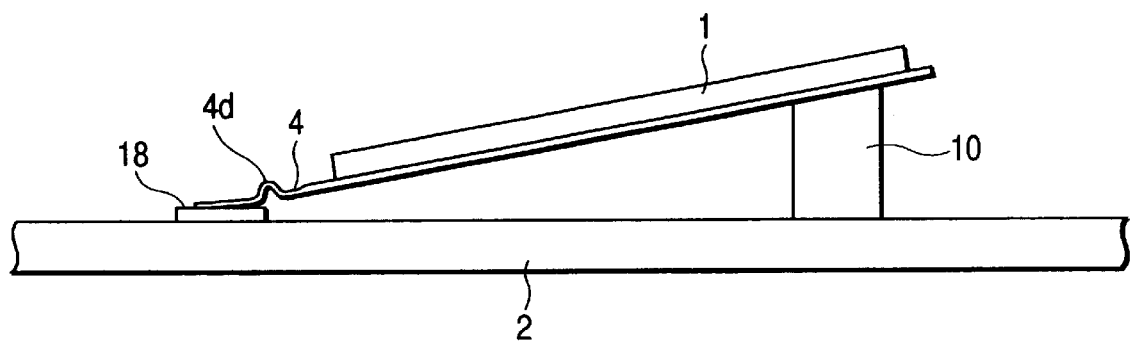
FIG. 18 is a diagram illustrating the method of mounting the tape carrier package.

As shown in FIGS. 17A through 17C, the positioning stage on which the TCP 1 is placed is moved in X and Y directions to position the TCP 1 to the reference point of a square fixing jig 22. Then, the TCP 1 is held by the vacuum nozzle 17 again to be carried to a predetermined position on the wiring board 2 according to predetermined positional information. As shown in FIG. 18, the lead 4 of the TCP 1 is temporarily attached to a foot print 18 of the wiring board 2 with solder paste printed beforehand. The solder is reflowed with the tilt angle of the TCP 1 relative to the mounting surface kept constant by the support lead 10 to solder the lead 4 to the foot print 18.

Figure 8:
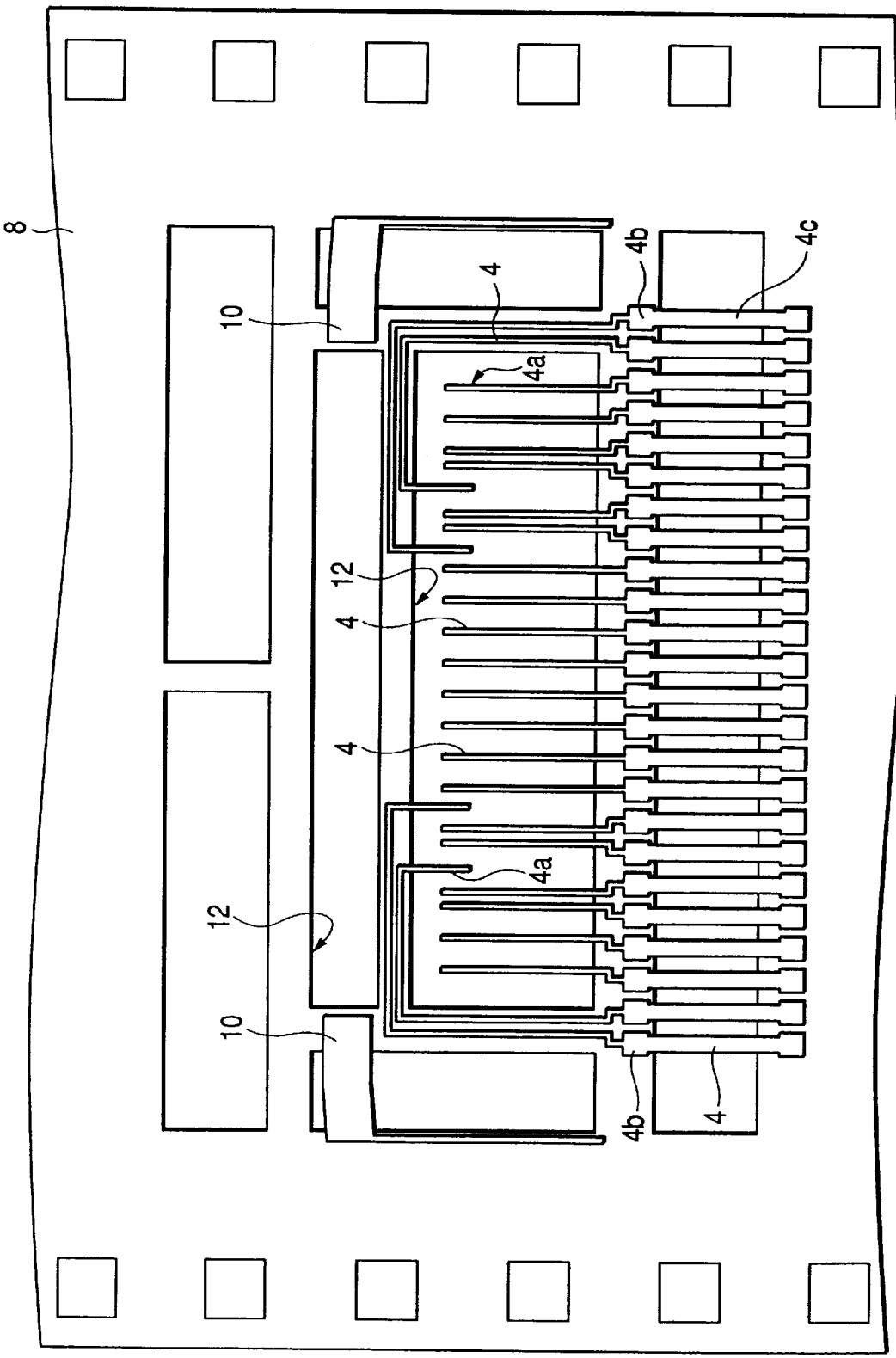
FIG. 8 is a top view illustrating a method of manufacturing the tape carrier package.

At this moment, to prevent the reflowed solder from creeping the lead 4 up to the base end portion 4b (refer to FIG. 8) thereof to melt with the solder of an adjacent lead 4, namely to prevent a so-called solder bridge failure from occurring, a bent 4d as shown in the figure is provided halfway along the lead 4 to pool the solder, thereby preventing the same from creeping up to the base end portion 4b. In addition, this bent 4d acts to mitigate or absorb a stress applied to the lead 4 by means of the deformation of the bent, thereby preventing the lead 4 from being broken.

Figure 20:
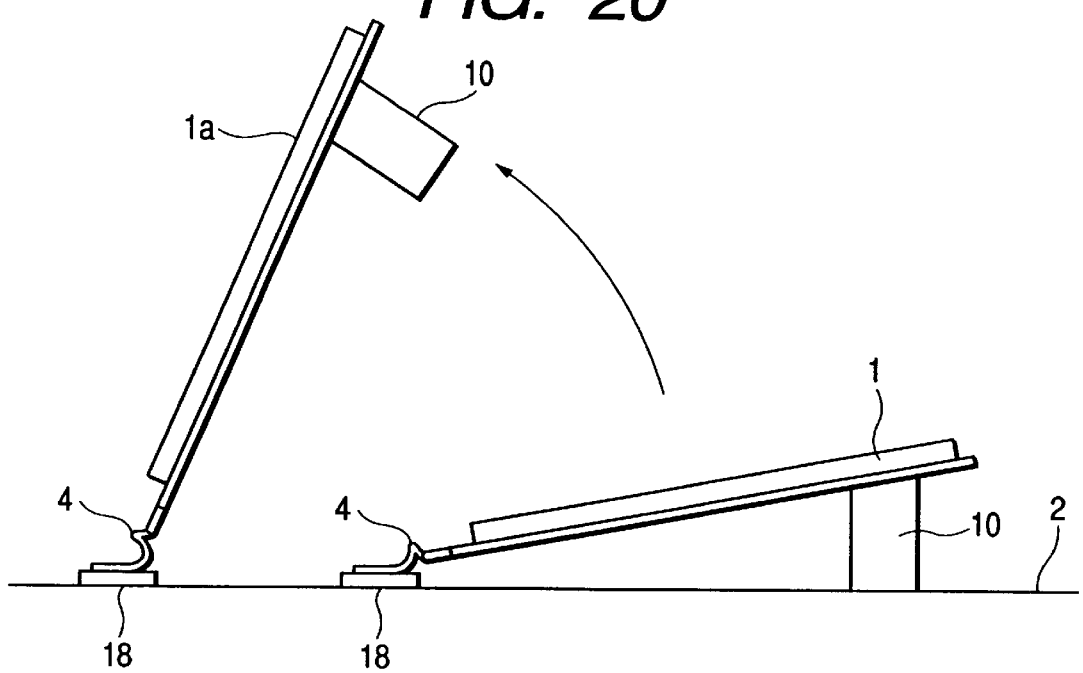
FIG. 20 is a diagram illustrating a method of repairing the tape carrier package.
Figure 21:
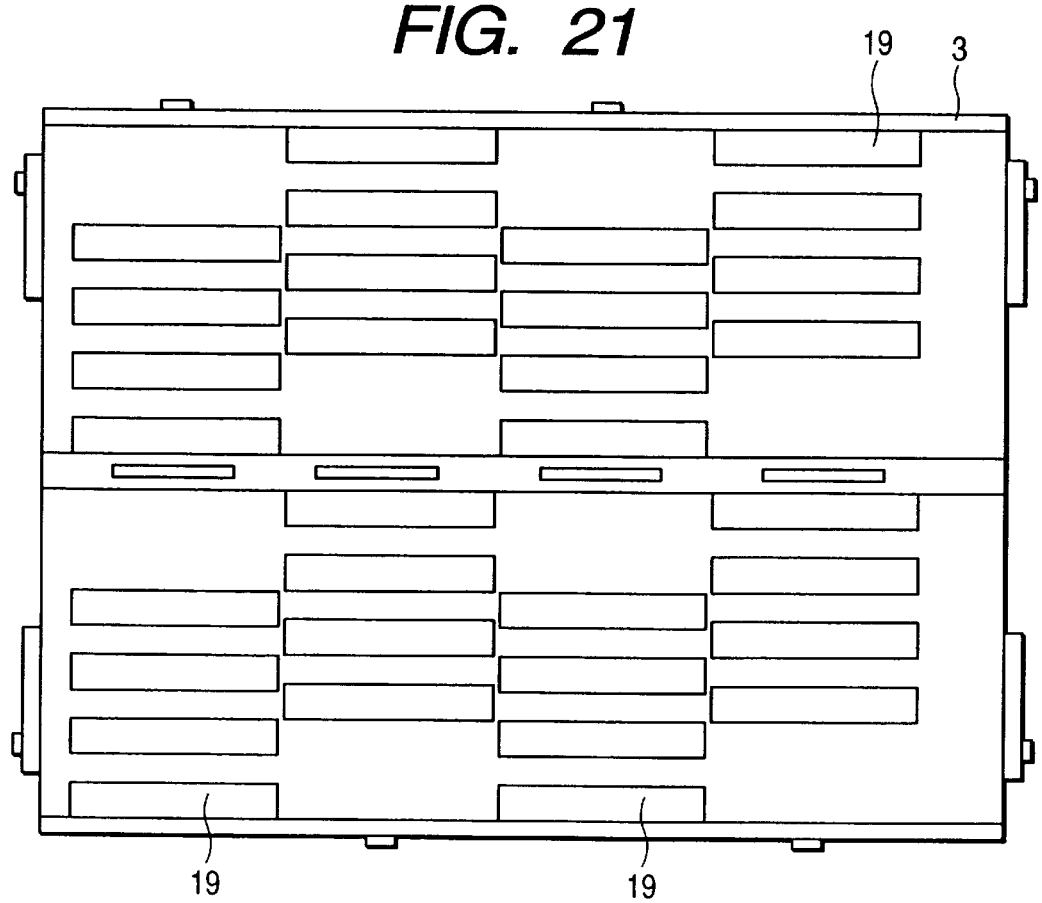
FIG. 21 is a top view illustrating in an expanded manner a case for accommodating the wiring board.

When mounting the TCP 1 on the wiring board 2, the support lead 10 is not fixed to the wiring board 2. By doing so, if the TCP 1 mounted so that a part thereof gets under an adjacent TCP 1a fails after mounting, the adjacent TCP 1 may be lifted around the junction between the wiring board 2 and the lead 4 as shown in FIG. 20 to replace the failing TCP 1 with ease. Also, when mounting the TCP 1 on the wiring board 2, small electronic parts (6, 7) such as the chip capacitor and an LSI package of planar mounting type such as a CSP (Chip Size Package) are mounted as required at the same time.

Figure 19:
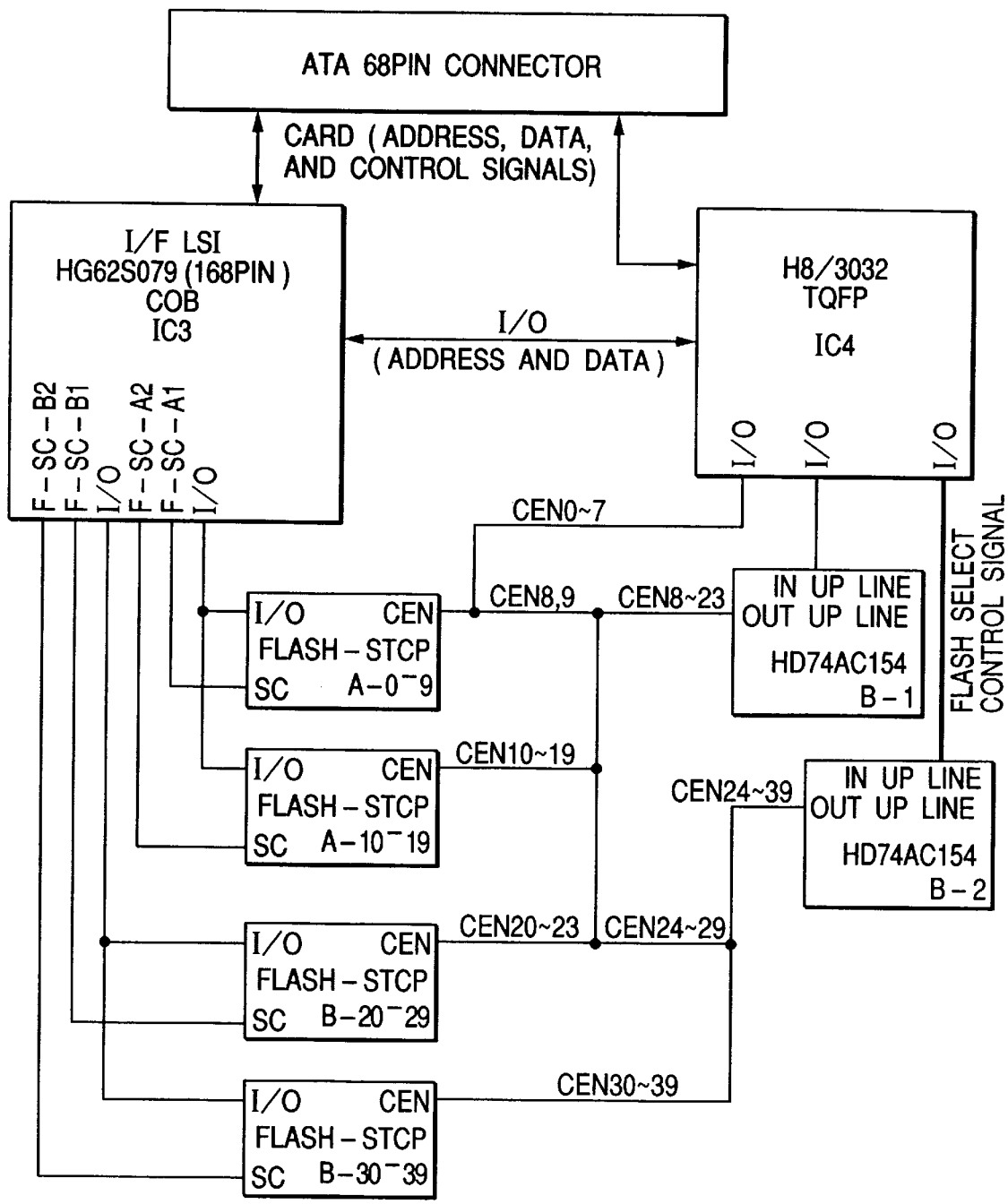
FIG. 19 is a circuit diagram illustrating a memory module of the above-mentioned preferred embodiment.

Then, when the wiring board 2 mounted with TCPs 1 is accommodated in the case 3, the memory module shown in FIGS. 1 and 2 is completed. FIG. 19 is a circuit diagram of the memory module practiced as the above-mentioned embodiment of the invention.

Figure 22:
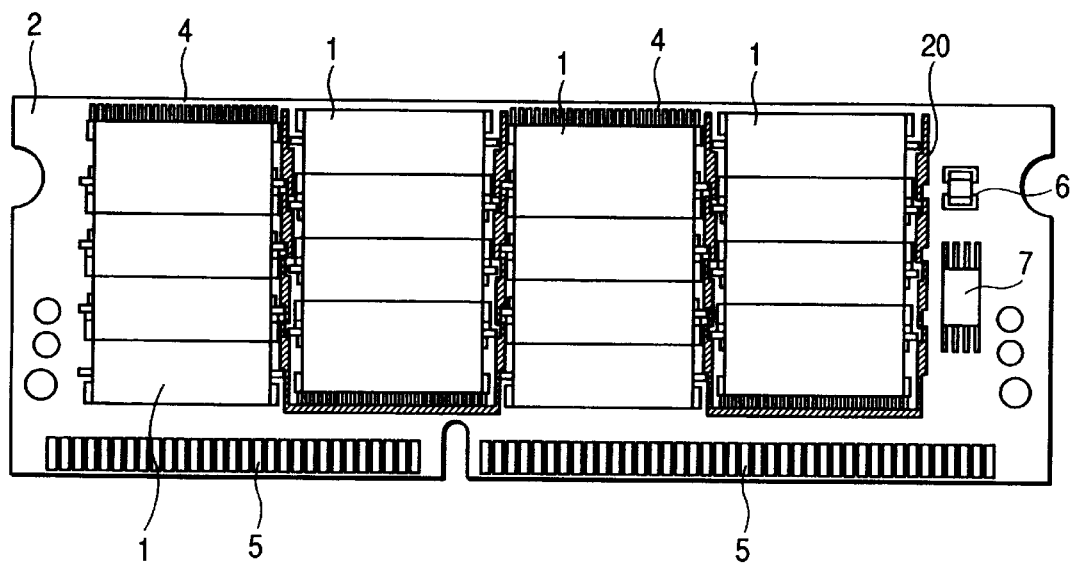
FIG. 22 is a top view illustrating a memory module practiced as another preferred embodiment of the invention.
Figure 23:
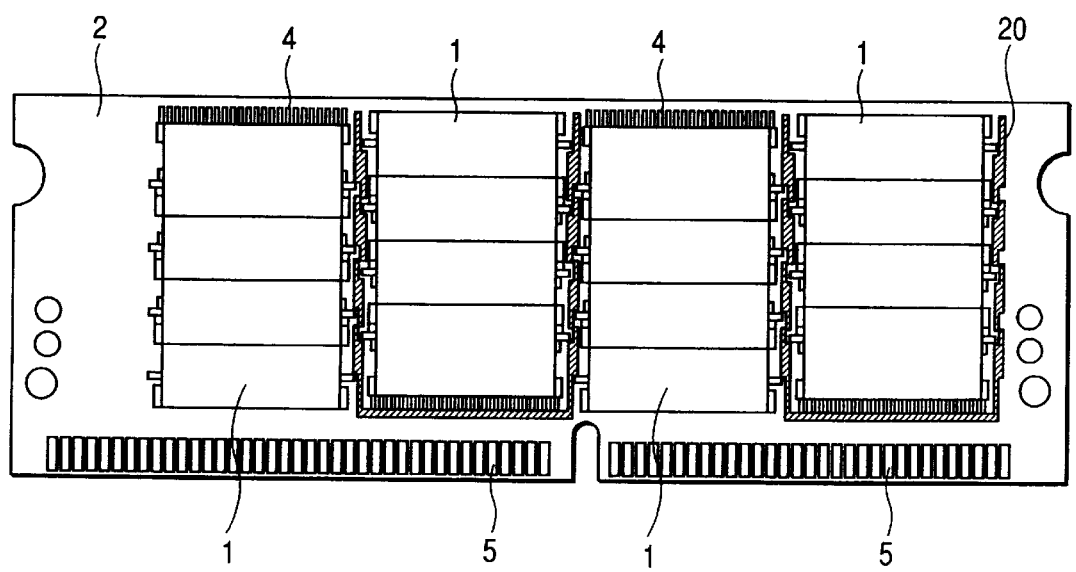
FIG. 23 is a top view illustrating the memory module of the above-mentioned another preferred embodiment.
Figure 24:
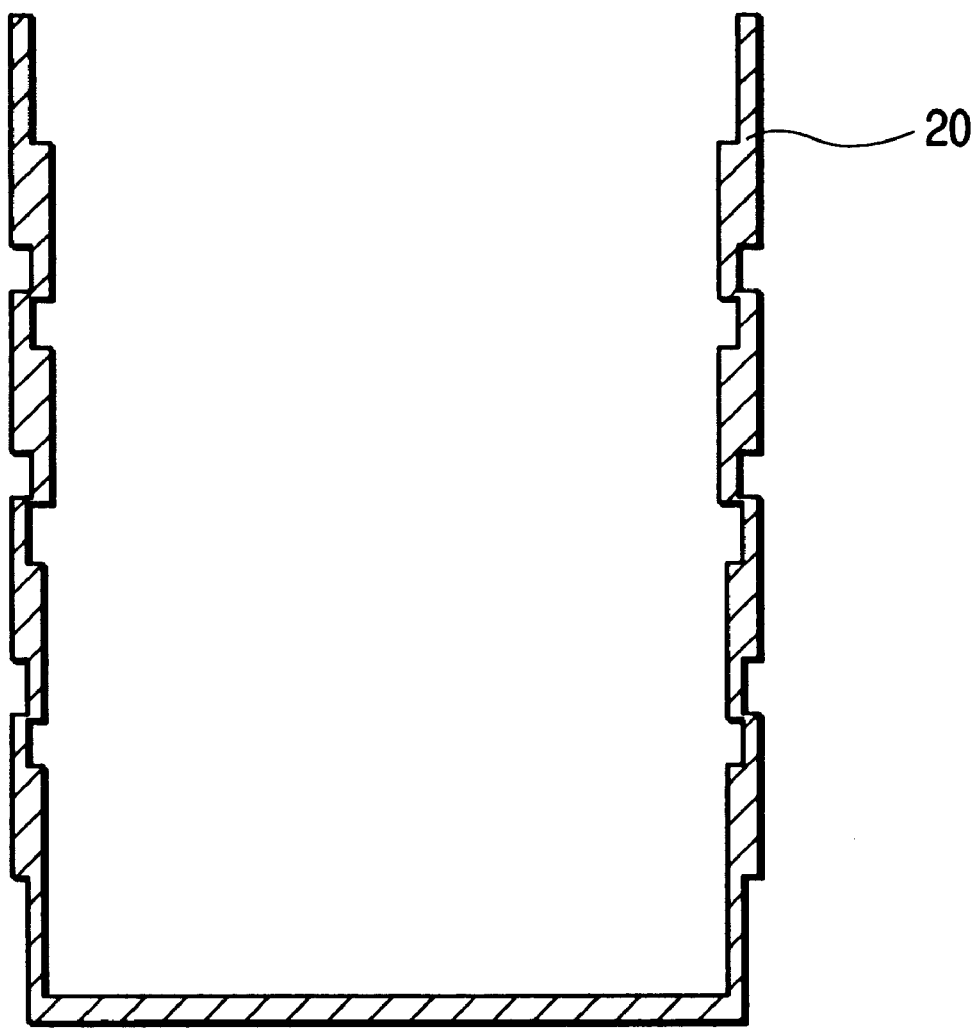
FIG. 24 is an expanded view illustrating a spacer.

The case 3 for accommodating the wiring board 2 is formed by punching a thin metal sheet having a high thermal conductivity such as aluminum (Al), folding the resultant thin metal sheet into two parts, and inserting the wiring board 2 between the these parts. This structure prevents the TCPs 1 mounted on the wiring board 2 from being deformed. In doing so, a resin sheet shaped as shown in FIG. 24 may be inserted between the TCPs 1 mounted on the wiring board 2 as a spacer 20 as shown in FIGS. 22 and 23. This arrangement enhances the mechanical strength of the memory module, thereby preventing the TCPs 1 from being deformed by a strong force that is applied to the case 3 when the memory module is inserted in the socket of a mother board. The spacer 20 is fixed to the wiring board 2 by means of an adhesive or mechanical insertion.

Preferred Embodiment 2

An electronic apparatus practiced as a second preferred embodiment of the invention is a memory card for use as an external auxiliary storage device for a note-size personal computer for example.

Figure 25A:
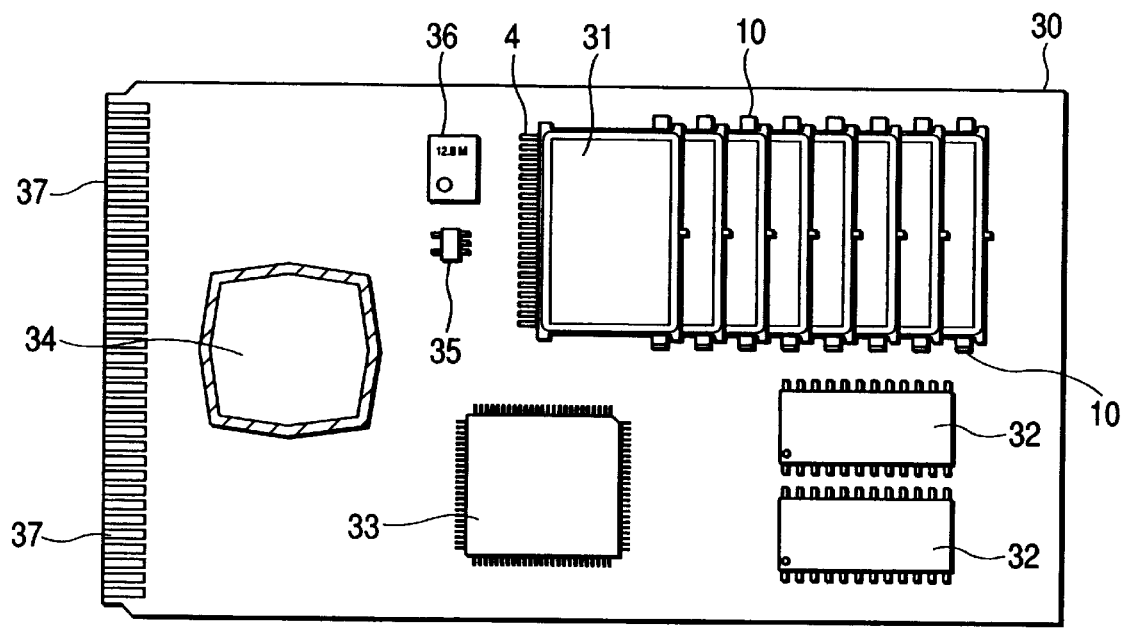
FIG. 25A is a top view illustrating the front surface of a memory card practiced as still another preferred embodiment of the invention and FIG. 25B is a top view illustrating the rear surface of the same.
Figure 25B:
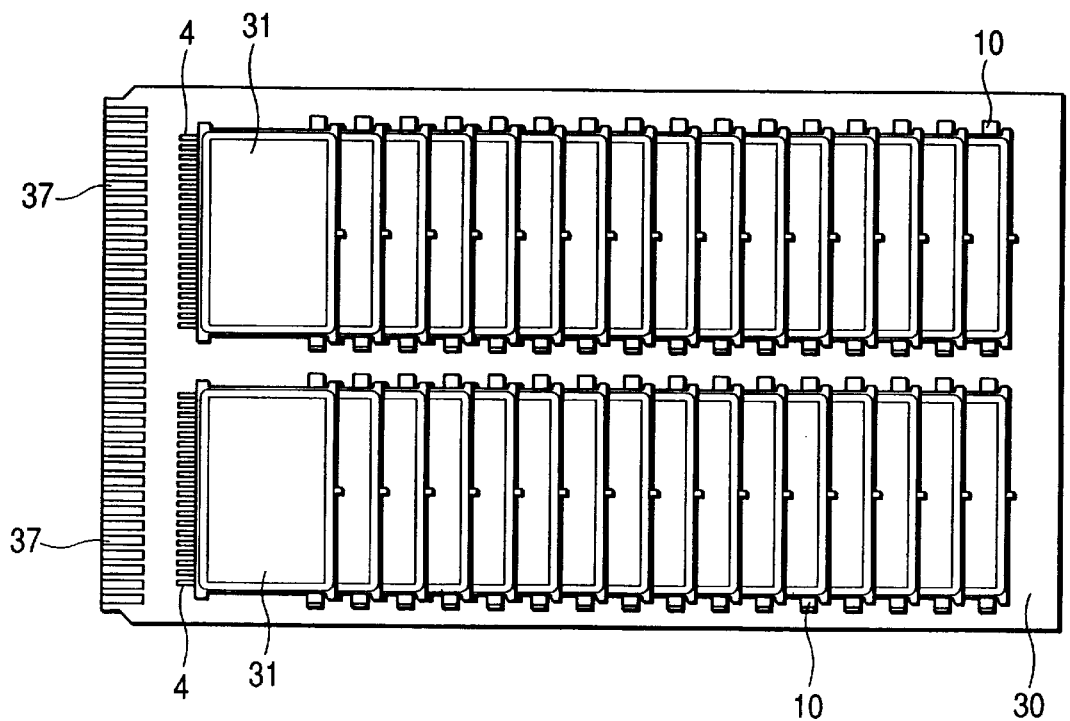
Figure 26A:
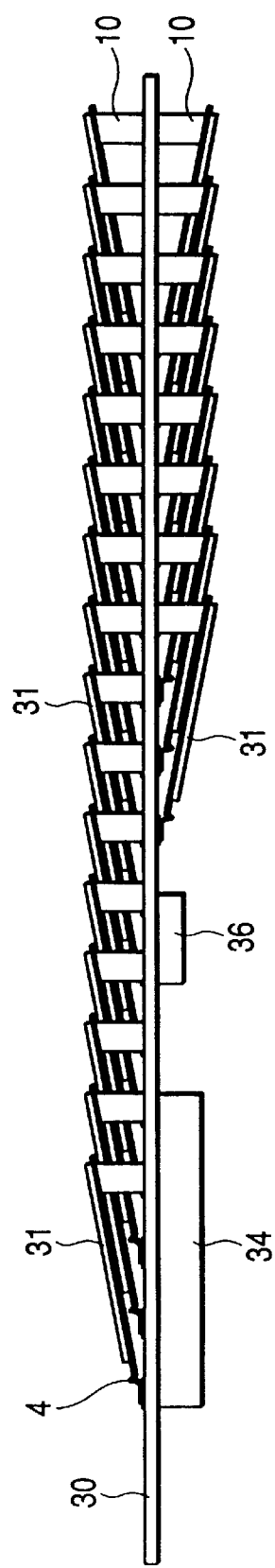
FIG. 26A and FIG. 26B are side views illustrating the above-mentioned memory card.
Figure 26B:
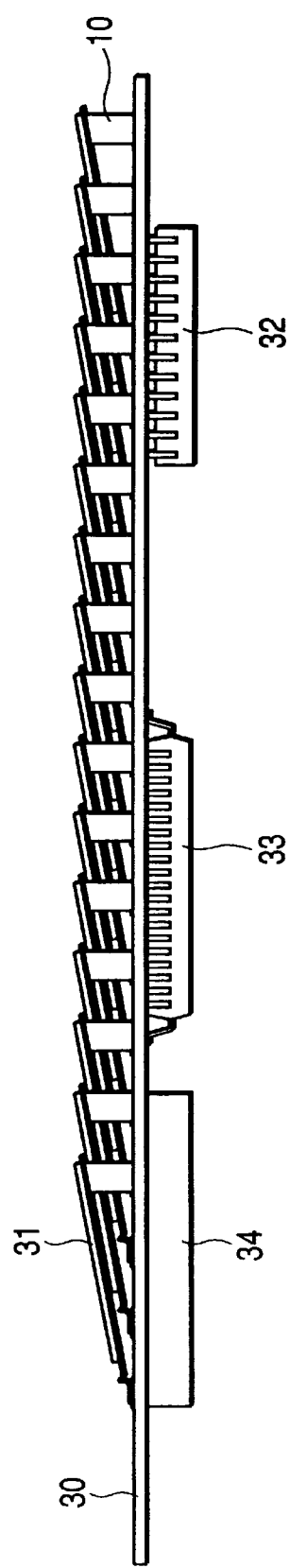

FIG. 25A is a top view illustrating the front side of a wiring board to be accommodated in this memory card. FIG. 25B is a top view illustrating the rear side of this wiring board. FIG. 26A is a side view illustrating one long side of this wiring board. FIG. 26B is a side view illustrating the other long side of the wiring board. It should be noted that a case for accommodating the wiring board is not shown.

Eight TCPs 31 are mounted in a row on the front surface of the wiring board 30. On the rear surface of the wiring board 30, 32 TCPs 31 are mounted in two rows (a total of 40 TCPs 31 on both sides). In each of the TCPs 32, a semiconductor chip (not shown) formed with a 64-megabit (Mbit) flash memory for example is encapsulated. Each TCP 31 is electrically connected to the wiring board 30 through a plurality of leads 4 arranged in a row along one side of the TCP 31.

The other portions of the front surface of the wiring board 30 are arranged with a decoder 32, a microcomputer 33, an interface circuit 34, a TTL 35 for reset signal generation, and a clock module 36. The interface circuit 34 is of a chip-on-board (COB) structure and can be constituted by a planar mount type package such as a chip size package (CSP). One of the short sides of the wiring board 30 is a connector that is arranged on the front and rear sides thereof with a plurality of terminals (connector pins) 37 in a row.

The 40 TCPs 31 mounted on the wiring board 2 are all of the same dimensions. As shown in FIGS. 26A and 26B, each TCP 31 is mounted with a small tilt angle to the mounting surface. The tilt angle is adjustable by means of the support lead 10 in the same manner as the TCP 1 of the first embodiment. Except for the TCP 31 arranged at one end of the wiring board, the TCPs 31 are mounted such that a portion of each gets under the adjacent one. The overlapped portion is provided a slight gap in between.

The above-mentioned mounting structure keeps extremely small the thickness (or height) of the wiring board 30 mounted on both sides with the TCPs 31, complying with the memory card standards strict in height specification (a maximum of 5 mm). The above-mentioned mounting structure also realizes the high-density mounting of many TCPs 31 on the wiring board 30 limited in mounting dimensions. The TCP 31 may be fabricated and mounted on the wiring board 30 in generally the same manner as described with respect to the above-mentioned preferred embodiment 1.

Figure 27A:
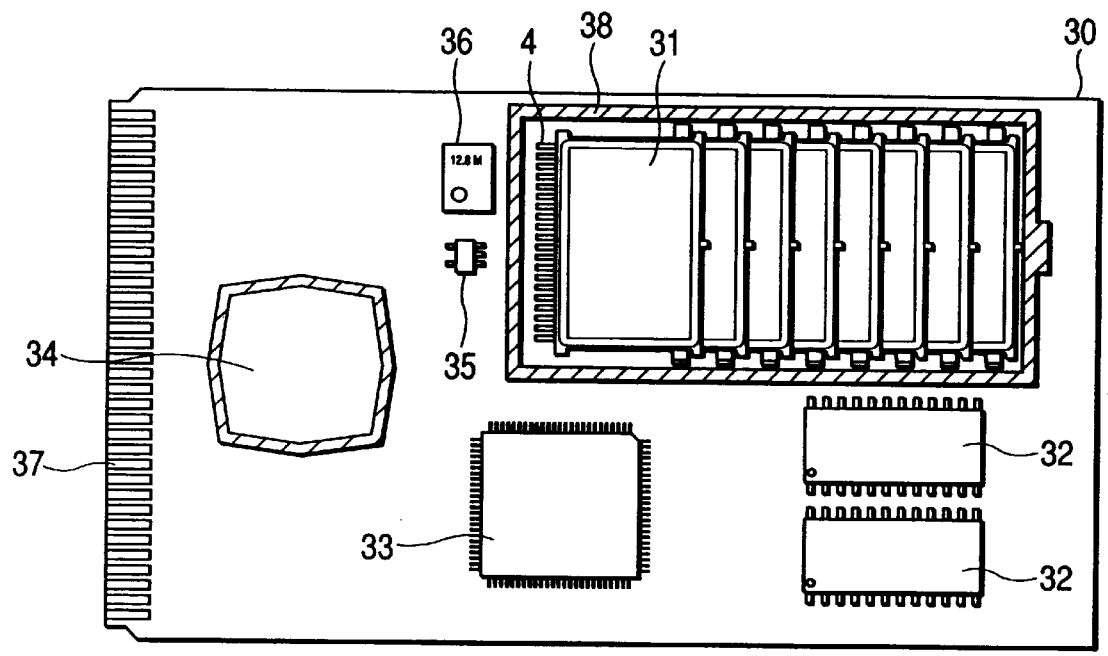
FIG. 27A is a top view illustrating the front surface of the above-mentioned memory card and FIG. 27B is a top view illustrating the rear side of the same.
Figure 27B:
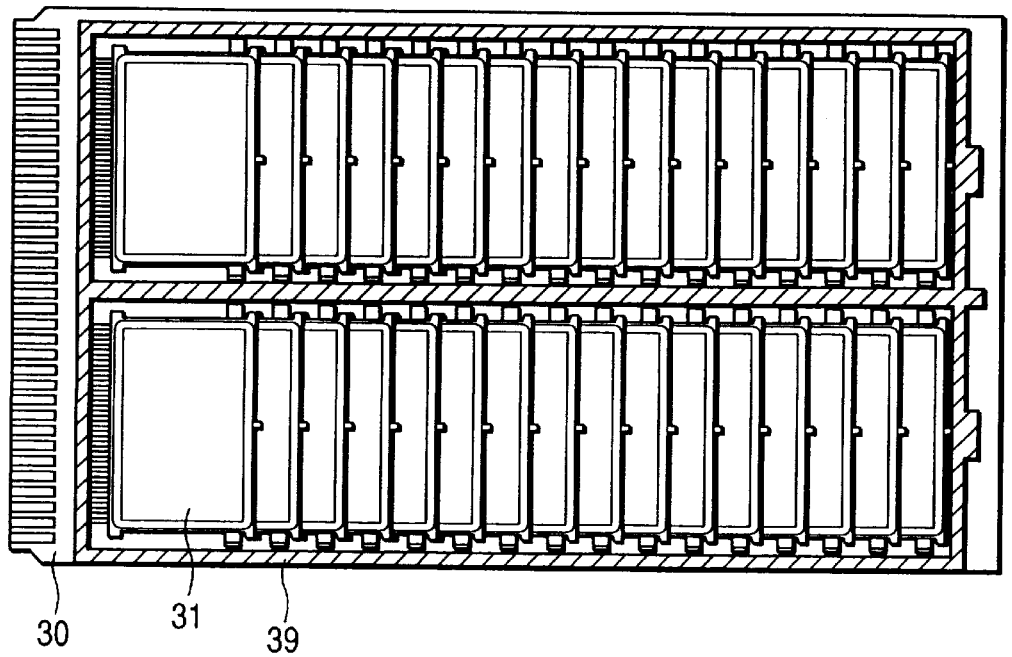
Figure 28:
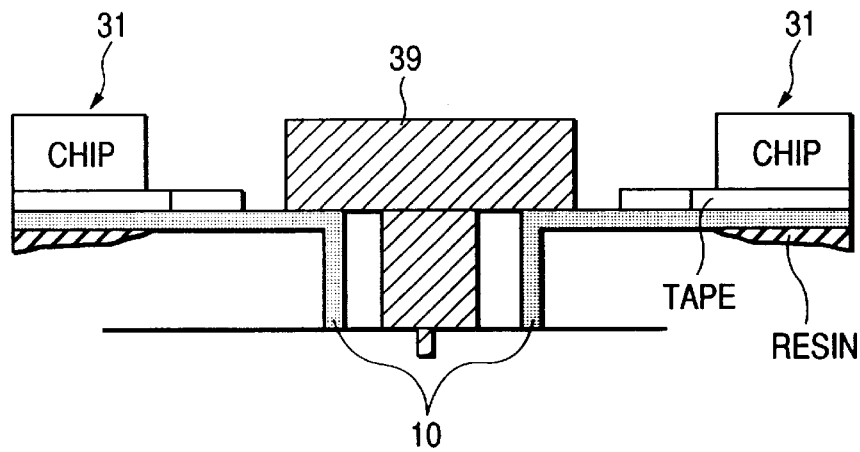
FIG. 28 is a diagram illustrating spacer arrangement.
Figure 29A:
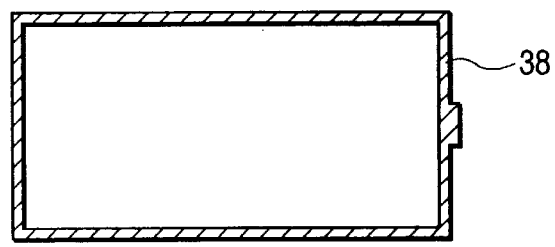
FIG. 29A and 29B are expanded top views illustrating spacers.
Figure 29B:
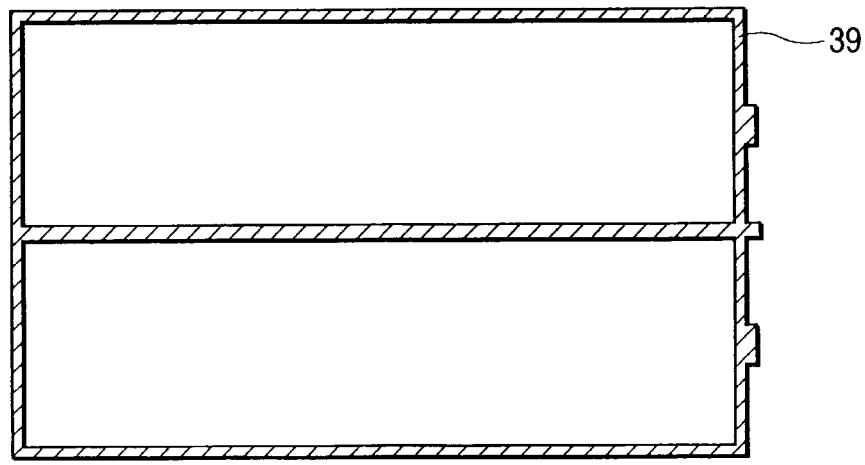

As shown in FIGS. 27A, 27B, and 28, spacers 38 and 39 as shown in FIGS. 29A and 29B are inserted into a gap of the TCPs 31 to enhance the mechanical strength of the memory card. The spacer 38 is arranged around the 8 TCPs 31 mounted on the front surface of the wiring board 30. The spacer 39 is arranged around the 32 TCPs 31 mounted on the rear surface of the wiring board 30.

Figure 30:
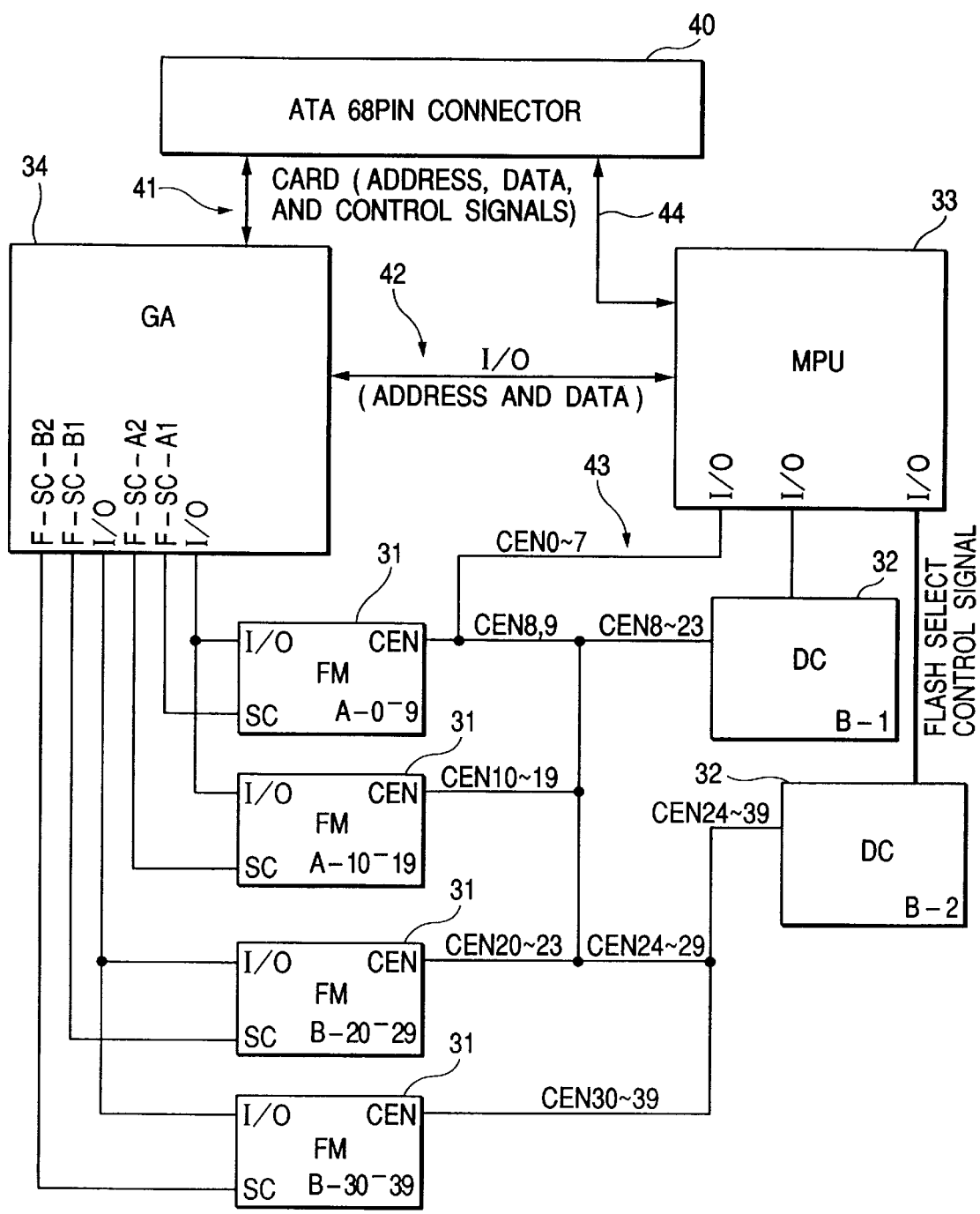
FIG. 30 is a circuit diagram illustrating the above-mentioned memory card.

FIG. 30 is a circuit diagram illustrating the memory card of the second embodiment fabricated as described above.

The memory card described with reference to FIGS. 25 through 29 constitutes an ATA (AT Attachment) card system shown in FIG. 30 for example. The ATA card complies with the interface and protocol to be used by an AT-compatible computer for accessing a hard disk drive. This card is standardized by the standardizing organization of PCMCIA (Personal Computer Memory Card International Association).

Reference numeral 40 denotes the pin connector of the ATA card that corresponds to an external terminal 37. Through this external terminal 37, the ATA card transfers signals with a PC (Personal Computer) or a PDA (Personal Digital Assistant). The number of external terminals and the names and numbers thereof are determined by PCMCIA.

Externally supplied data and addresses are inputted in a gate array GA 34 through a signal line 41. The gate array GA controls an external PCMCIA interface, a microcomputer MPU 33, a flash memory FM 31, and the data transfer between the flash memory FM 31 and the PCMCIA interface. The transfer of data and addresses between elements in the card is performed through a local data bus and a local address bus referenced at 42.

The MPU 33 receives an externally supplied command 44 to perform data control. Externally supplied data is sent to the flash memory FM 31 through a decoder DC for high-speed data processing for both read and write operations. Selection of the flash memory FM 31 for data writing and data reading is controlled by a CEN (Chip Enable) bus 43. Further, to enhance the reliability of the data stored in the flash memory FM 31, the MPU 33 performs ECC (Error Check and Correction) (for controlling the count of rewriting of each section and controlling access to failing sectors) and wear leveling (averaging the count of rewriting failing sectors).

While the preferred embodiments of the present invention have been described using specific terms, such description is for illustrative purposes only, and it is to be understood that changes and variations may be made without departing from the spirit or scope of the appended claims.

What is claimed is:

1. A semiconductor device comprising:
    a wiring board having a plurality of wiring layers and a plurality of terminals connected to said plurality of wiring layers; and
    a plurality of semiconductor packages mounted on said wiring board;
    each of said plurality of semiconductor packages having
        an insulating tape rectangular in shape having a device hole,
        a semiconductor chip rectangular in shape formed on a main surface thereof with an integrated circuit and a plurality of bonding pads, said semiconductor chip being arranged in said device hole of said insulating tape, a plurality of first leads formed on one surface of said insulating tape, each of said plurality of first leads having a first portion extending over said main surface of said semiconductor chip and a second portion formed integrally with said first portion and projecting from one long side of said insulating tape to outside, an end of said first portion being electrically connected to corresponding one of said plurality of bonding pads of said semiconductor chip, a support lead formed on one surface of said insulating tape and projecting from a short side of said insulating tape outside, and a resin layer for encapsulating said main surface of said semiconductor chip and said first portion of said first lead;

wherein
a tip of said second portion of said first lead of each of said plurality of semiconductor packages is connected to corresponding one of said plurality of terminals of said wiring board, the tip of said support lead of each of said plurality of semiconductor packages comes in contact with said wiring board, each of said plurality of semiconductor packages is mounted on said wiring board with a predetermined tilt angle defined by the length of said support lead in a thickness direction of said wiring board, and said plurality of semiconductor packages are arranged in a predetermined direction, each of said plurality of semiconductor packages partially overlapping adjacent ones in a planar manner.

2. The semiconductor device according to claim 1, wherein said predetermined tilt angle is not more than 45 degrees.

3. The semiconductor device according to claim 1, wherein the adjacent semiconductor packages are arranged with a predetermined interval in an area of the planar overlapping.

4. The semiconductor device according to claim 1, wherein said second portion of said first lead of each of said plurality of semiconductor packages has a bent between said tip connected to said corresponding one of said plurality of terminals of said wiring board and said insulating tape.

5. The semiconductor device according to claim 1, wherein a rear surface of said semiconductor chip of each of said plurality of semiconductor packages is exposed from said resin layer.

6. The semiconductor device according to claim 1, wherein a third portion is provided between said first portion and said second portion of said first lead of each of said plurality of semiconductor packages, said third portion being wider than said first portion and said second portion, a rim portion of said resin layer being positioned in the proximity of said third portion of said first lead.

7. A semiconductor device comprising:
a wiring board rectangular in shape having a plurality of wiring layers and a plurality of terminals connected to said plurality of wiring layers, said wiring board having a pair of long sides extending in a first direction and a pair of short sides extending in a second direction different from said first direction;

a plurality of first semiconductor packages mounted on said wiring board; and a plurality of second semiconductor packages mounted on said wiring board;

each of said plurality of first semiconductor packages and said plurality of second semiconductor packages having an insulating tape rectangular in shape having a device hole, a semiconductor chip rectangular in shape formed on a main surface thereof with an integrated circuit and a plurality of bonding pads, said semiconductor chip being arranged in said device hole of said insulating tape, a plurality of first leads formed on one surface of said insulating tape, each of said plurality of first leads having a first portion extending over said main surface of said semiconductor chip and a second portion formed integrally with said first portion and projecting from one long side of said insulating tape to outside, an end of said first portion being electrically connected to corresponding one of said plurality of bonding pads of said semiconductor chip, a support lead formed on one surface of said insulating tape and projecting from a short side of said insulating tape outside, and a resin layer for encapsulating said main surface of said semiconductor chip and said first portion of said first lead;

wherein
a tip of said second portion of said first lead of each of said plurality of first semiconductor packages and said plurality of second semiconductor packages is connected to corresponding one of said plurality of terminals of said wiring board, the tip of said support lead of each of said plurality of first semiconductor packages and said plurality of second semiconductor packages comes in contact with said wiring board, each of said plurality of first semiconductor packages and said plurality of second semiconductor packages is mounted on said wiring board with a predetermined tilt angle defined by the length of said support lead in a thickness direction of said wiring board, said plurality of first semiconductor packages are arranged from one long side of said wiring board along said second direction, the adjacent semiconductor packages overlapping each other in a planar manner, said plurality of second semiconductor packages are arranged from the other long side of said wiring board along said second direction, the adjacent semiconductor packages overlapping each other in a planar manner, and said plurality of first semiconductor packages and said plurality of second semiconductor packages are adjacently arranged in said first direction.

8. The semiconductor device according to claim 7, wherein said predetermined tilt angle is not more than 45 degrees.

9. The semiconductor device according to claim 7, wherein said adjacent packages are arranged with a predetermined interval in an area of the planar overlapping.

10. The semiconductor device according to claim 7, wherein said second portion of said first lead of each of said plurality of first semiconductor packages and said plurality of second semiconductor packages has a bent between said tip connected to said corresponding one of said plurality of terminals of said wiring board and said insulating tape.

11. The semiconductor device according to claim 7, wherein a rear surface of said semiconductor chip of each of said plurality of first semiconductor packages and said plurality of second semiconductor packages is exposed from said resin layer.

12. The semiconductor device according to claim 7, wherein a third portion is provided between said first portion and said second portion of said first lead of each of said plurality of first semiconductor packages and said plurality of second semiconductor packages, said third portion being wider than said first portion and said second portion, a rim portion of said resin layer being positioned in the proximity of said third portion of said first lead.

* * * * *